(12) United States Patent
Avanzino et al.

(10) Patent No.: US 6,350,687 B1
(45) Date of Patent: Feb. 26, 2002

(54) METHOD OF FABRICATING IMPROVED COPPER METALLIZATION INCLUDING FORMING AND REMOVING PASSIVATION LAYER BEFORE FORMING CAPPING FILM

(75) Inventors: Steven C. Avanzino, Cupertino; Kai Yang, Freemont; Sergey Lopatin, Santa Clara; Todd P. Lukanc, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/271,171

(22) Filed: Mar. 18, 1999

(51) Int. Cl.$^7$ ............................................. H01L 21/44
(52) U.S. Cl. .................. 438/687; 438/618; 438/622; 438/637; 438/672; 438/675; 438/678; 438/958; 438/976
(58) Field of Search ................................. 438/618, 687, 438/902, 958, 976, 622, 625–627, 631, 633, 637, 641, 672, 675, 678, 680

(56) References Cited

U.S. PATENT DOCUMENTS

| | | | | |
|---|---|---|---|---|
| 5,599,742 A | * | 2/1997 | Kadomura | 437/194 |
| 5,674,787 A | * | 10/1997 | Zhao et al. | 437/230 |
| 5,693,563 A | * | 12/1997 | Teong | 437/190 |
| 5,746,947 A | * | 5/1998 | Vanderpool et al. | 252/394 |
| 6,100,195 A | * | 8/2000 | Chan et al. | 438/687 |

* cited by examiner

Primary Examiner—Matthew Smith
Assistant Examiner—Craig P. Lytle

(57) ABSTRACT

A selected passivating layer is purposely formed on an exposed surface of a Cu and/or Cu alloy interconnect member, thereby avoiding the adverse consequences stemming from formation of a thick copper oxide layer thereon. The passivating layer is formed by treating the exposed surface of the Cu or Cu alloy interconnect member: (a) with a copper corrosion-inhibiting chemical; or (b) by electroless plating a metal layer on the surface of the Cu or Cu alloy layer; or (c) depositing a metallic compound on the surface of the Cu or Cu alloy layer by CVD. The passivating layer can then be removed. Embodiments include electroplating or electroless plating Cu or a Cu alloy to fill a damascene opening in an ILD, chemical mechanical polishing, then treating the exposed surface of the Cu/Cu alloy interconnect to form the passivating, layer thereon, and depositing a silicon nitride diffusion barrier layer thereon.

10 Claims, 2 Drawing Sheets

METHOD OF FABRICATING IMPROVED COPPER METALLIZATION INCLUDING FORMING AND REMOVING PASSIVATION LAYER BEFORE FORMING CAPPING FILM

TECHNICAL FIELD

The present invention relates to copper (Cu) or Cu alloy metallization in semiconductor devices. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios due to miniaturization.

Conventional semiconductor devices comprise a semiconductor substrate, typically doped monocrystalline silicon on which transistors are formed, and a plurality of sequentially formed inter-layer dielectrics (ILDs) and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines formed in trench openings typically extend substantially horizontal with respect to the semiconductor substrate. Semiconductor integrated circuits comprising five or more levels of metallization are becoming more prevalent as device geometries shrink to submicron levels.

A conductive plug filling a via hole is typically formed by depositing an ILD on a conductive layer comprising at least one conductive pattern, forming an opening through the ILD by conventional photolithographic and etching techniques, and filling the opening with a conductive material, such as tungsten (W). Excess conductive material on the surface of the ILD is typically removed by chemical mechanical polishing (CMP). One such method is known as damascene and basically involves the formation of all opening which is filled in with a metal. Dual damascene techniques involve the formation of an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The transmission speed of a signal along an interconnection pattern varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Thus, the interconnection pattern limits the speed of the integrated circuit.

If the interconnection node is routed over a considerable distance, e.g., hundreds of microns or more as in submicron technologies, the interconnection capacitance limits the circuit node capacitance loading and, hence, the circuit speed. As integration density increases and feature size decreases in accordance with submicron design rules, the rejection rate of ICs due to integrated circuit speed delays significantly reduces yield and increases manufacturing costs.

One way to increase the speed of semiconductor circuitry is to reduce the resistance of a conductive pattern. Conventional metallization patterns are typically formed by depositing a layer of conductive material, notably aluminum (Al) or an alloy thereof, patterning by photolithography and etching, or by damascene techniques wherein trenches are patterned and etched in dielectric layers and filled with a conductive material. Excess conductive material on the surface of the dielectric layer is then removed by CMP. Al is conventionally employed because it is relatively inexpensive, exhibits low resistivity and is relatively easy to etch. However, as the size of openings for vias/contacts and trenches is scaled down to the sub-micron range, step coverage problems have arisen involving the use of Al which has decreased the reliability of interconnections formed between different wiring layers. Such poor step coverage results in high current density and enhanced electromigration. Moreover, low dielectric constant polyimide materials, when employed as interlayer dielectrics, create moisture/bias reliability problems when in contact with Al.

One approach to improved interconnection paths in vias comprises the use of completely filled plugs of a metal, such as of W. Accordingly, many current semiconductor devices utilizing VLSI (very large scale integration) technology employ Al for a wiring metal and W plugs for interconnections at different levels. However, the use of W is attendant with several disadvantages. For example, most W processes are complex and expensive. Moreover, W has a high resistivity. The Joule heating may enhance electromigration of adjacent Al wiring. Furthermore, W plugs are susceptible to void formation, and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Cu and Cu alloys have received considerable attention as a candidate for replacing Al in VLSI interconnect metallizations. Cu exhibits superior electromigration properties and has a lower resistivity than Al. In addition, Cu has improved electrical properties vis-à-vis W, making Cu a desirable metal for use as a conductive plug as well as conductive wiring.

Electroless plating and electroplating of Cu and Cu alloys offer the prospect of low cost, high throughput, high quality plated films and efficient via, contact and trench filling capabilities. Electroless plating generally involves the controlled autocatalytic deposition of a continuous film on the catalytic surface by the interaction in solution of a metal salt and a chemical reducing agent. Electroplating comprises the electro deposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. For electroless plating, very thin catalytic layers, e.g., less than 100A, can be employed in the form of islets of catalytic metal.

There are disadvantages attendant upon the use of Cu or Cu alloys. For example, Cu readily diffuses through silicon dioxide, the typical dielectric interlayer material employed in the manufacture of semiconductor devices, into silicon elements and adversely affects device performance.

One approach to forming Cu plugs and wiring comprises the use of damascene structures employing CMP, as in Teong, U.S. Pat. No. 5,693,563. However, due to Cu diffusion through dielectric interlayer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), tungsten (W), tungsten nitride (WN), Ti-TiN, titanium silicon nitride (TiSiN), tungsten silicon nitride (WSiN), tantalum silicon nitride (TaSiN) and silicon nitride (silicon nitride) for encapsulating Cu. The use of such barrier materials to encapsulate Cu is not limited to the interface between Cu and the dielectric interlayer, but includes interfaces with other metals as well.

There are, however, significant problems attendant upon conventional Cu interconnect methodology. For example, conventional practices comprise forming damascene openings in an ILD, depositing Cu or a Cu alloy layer, chemical-mechanical polishing, and forming a capping layer on the exposed surface of the Cu or Cu alloy. It was found, however, that after CMP, the exposed surface of the Cu or Cu alloy rapidly oxidizes resulting in the formation of a thin, porous and brittle copper oxide surface layer. Consequently, the capping layer exhibits poor adhesion to the Cu or Cu alloy surface and is vulnerable to removal, as by peeling due to scratching or stresses resulting from subsequent deposition of layers. As a result, the Cu or Cu alloy is not entirely encapsulated and Cu diffusion occurs thereby adversely affecting device performance and decreasing the electromigration resistance of the Cu or Cu alloy interconnect member.

As design rules extend deeper into the submicron range, e.g., about 0.18 microns and under, the reliability of the interconnect pattern becomes particularly critical. Accordingly, the adhesion of capping layers to Cu interconnects requires even greater reliability.

There exists a need for efficient methodology enabling the formation of encapsulated Cu and Cu alloy interconnect members having high reliability. There exists a particular need for selectively controlling the formation of a passivating layer on the exposed surface of the Cu or Cu alloy to improve process flow, device characteristics, and uniformity of device characteristics.

DISCLOSURE OF THE INVENTION

An advantage of the present invention is a method of manufacturing a semiconductor device having highly reliable Cu and Cu alloy interconnect members with substantially uniform characteristics.

Another advantage of the present invention is a method of manufacturing a semiconductor device comprising a Cu or Cu alloy interconnect member utilizing a selectively formed passivating layer.

Additional advantages of the present invention will be set forth in the description which follows and in part will become apparent to those having ordinary skill in the art upon examination of the following or may be learned from the practice of the present invention. The objects and advantages of the invention may be realized and obtained as particularly pointed out in the appended claims.

According to the present invention, the foregoing and other advantages are achieved in part by a method of manufacturing a semiconductor on a wafer, which method comprises:

forming a copper (Cu) or Cu alloy interconnection pattern comprising a dense array of spaced apart Cu or Cu alloy lines bordering an open dielectric field on a surface of the wafer; and forming a passivating layer on the surface of the Cu or Cu alloy layer by:
 (a) treating the surface of the Cu or Cu alloy layer with a solution of a copper corrosion-inhibiting compound; or
 (b) electroless plating a metal layer on the surface of the Cu or Cu alloy layer; or
 (c) depositing a metallic compound on the surface of the Cu/Cu alloy layer by chemical vapor deposition (CVD).

Additional advantages of the present invention will become readily apparent to those skilled in this art from the following detailed description, wherein embodiments of the present invention are described simply by way of illustrating of the best mode contemplated in carrying out the present invention. As will be realized, the present invention is capable of other and different embodiments, and its several details are capable of modifications in various obvious respects, all without departing from the present invention. Accordingly, the drawings and description are to be regarded as illustrative in nature and not as restrictive.

As used throughout this application, the symbol "Cu" denotes elemental or substantially elemental Cu, or a Cu alloy, such as Cu containing minor amounts of tin (Sn), titanium (Ti), germanium (Ge), zinc (Zn) or magnesium (Mg).

DESCRIPTION OF THE INVENTION

Figure 1:
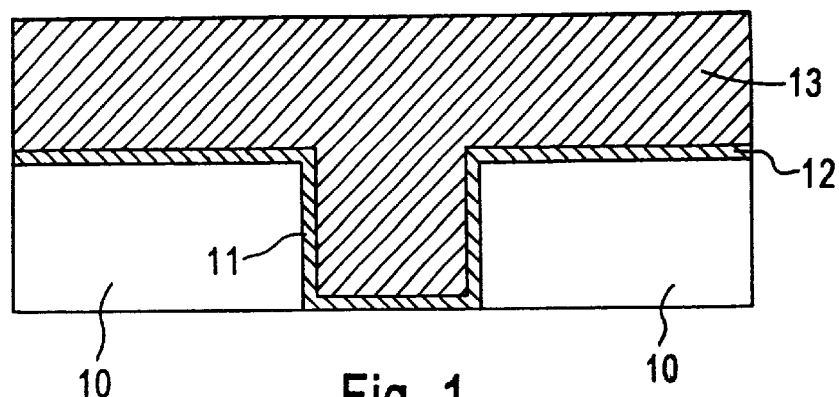
FIGS. 1–5 illustrate sequential phases of a method in accordance with an embodiment of the present invention.

The present invention addresses and solves problems attendant upon tile formation of a thin copper oxide layer on the exposed upper surface of a Cu or Cu alloy interconnect following CMP. The present invention provides advantageously greater control of the process flow and device uniformity by selectively forming a passivating layer on the exposed upper surface of a Cu or Cu alloy interconnect, e.g., subsequent to CMP.

As design rules are scaled down into the deep submicron range, e.g., about 0.18 microns and under, the reliability of encapsulated Cu and/or Cu alloy interconnect members becomes increasingly significant. It was found that conventional practices in forming a Cu and/or Cu alloy interconnect member in a damascene opening results in the formation of a thin copper oxide surface film, believed to comprise a mixture of CuO and $Cu_2O$, on the exposed upper surface of the Cu or Cu alloy interconnect following CMP. It is believed that such a thin copper oxide surface layer forms during CMP, and it is enhanced in thickness during subsequent exposure of the cleaned Cu or Cu alloy surface to ambient. Tile thin copper oxide film layer is porous and brittle in nature. The presence of such a thin copper oxide surface film undesirably reduces the adhesion of a capping layer, such as silicon nitride to the underlying Cu and/or Cu alloy interconnect member. Consequently, cracks are generated at the Cu or Cu alloy/copper oxide interface, thereby resulting in copper diffusion and increased electromigration as a result of such diffusion. The cracks occurring in the Cu or Cu alloy/copper oxide interface enhance surface diffusion, which is more rapid than grain boundary diffusion or lattice diffusion. In addition, the nature of such an oxide coating is not uniform from interconnect to interconnect or from chip to chip. Accordingly, it is difficult to provide uniform remedial treatment subsequent to formation of the oxide layer.

The present invention constitutes an improvement over conventional practices by selectively forming a controllable passivating layer on a Cu and/or Cu alloy interconnect member thereby substantially avoiding the formation of a thick oxide layer prior to depositing a capping layer, such as silicon nitride, thereon. The present invention enables the formation of a thin, controllable, uniform passivating layer on an exposed surface of a Cu or Cu alloy interconnect member following CMP. Advantageously, the purposely formed and strategically designed passivating layer can subsequently be removed with ease at selected conditions or even remain, as by forming a passivating layer which is conductive and exhibits good adhesion to both the underlying Cu metallization and subsequently deposited capping layer. In accordance with embodiments of the present invention, the passivating layer can be formed on the surface of the Cu or Cu alloy layer by:

(a) treating the surface of the Cu or Cu alloy layer with a copper corrosion-inhibiting compound. Examples of such compounds include, for example, azoles, benzotriazole, 1,2,4-triazole, 8-hydroxy quinoline, 2-mercaptobenzimidazole, imidazole, and alkanethiols. Depending upon the specific chemical chosen, the passivating film remaining on the Cu surface will have varying degrees of volatility. Alternatively, the passivating layer can be formed on the surface of the Cu or Cu alloy layer by:

(b) electroless plating a metal layer on the surface of the Cu or Cu alloy layer; or (c) by depositing selectively a metallic compound on the surface of the Cu/Cu alloy layer by CVD.

In accordance with embodiments of the present invention, the exposed surface of the Cu and/or Cu alloy layer is treated to form a selected, controlled passivating film, thereby avoiding the formation of all uncontrolled, non-uniform copper oxide film.

Cu and/or Cu alloy interconnect members formed in accordance with embodiments of the present invention can be, but are not limited to, interconnects formed by damascene technology. Thus, embodiments of the present invention include forming an ILD overlying a substrate, forming an opening, e.g., a damascene opening, in the ILD, depositing a diffusion barrier layer, such as TaN, and filling the opening with Cu or a Cu alloy layer. Advantageously, the opening in the ILD can be filled by initially depositing a seed layer and then electroplating or electroless plating tile Cu or Cu alloy layer. CMP is then performed such that the upper surface of the Cu or Cu alloy layer is substantially coplanar with the upper surface of the ILD. To prevent formation of a thick copper oxide after CMP is performed X in accordance with embodiments of the present invention, the exposed surface of the Cu and/or Cu alloy layer is passivated in a selectively controlled manner before a thick copper oxide film forms on the surface thereof. Subsequently, the passivating layer can be removed, thereby presenting a clean surface prior to deposition of the capping layer thereon.

Given the present disclosure and the objectives of the present invention, the conditions during formation of and/or removal of the passivating layer can be optimized in a particular situation.

In various embodiments of the present invention, conventional substrates and ILDs, barrier layers and capping layers can be employed. For example, the substrate can be doped monocrystalline silicon or gallium-arsenide. The ILD employed in the present invention can comprise any dielectric material conventionally employed in the manufacture of semiconductor devices. For example, dielectric materials such as silicon dioxide, phospho-silicate-glass (PSG), boro-phosphiosilicate glass (BPSG), and silicon dioxide derived from tetraethylorthosilicate (TEOS) or silane by PECVD can be employed. The openings formed in dielectric layers are effected by conventional photolithographic and etching techniques. ILDs in accordance with the present invention can also comprise low dielectric constant materials, including polymers, such as polyimides. The conditions under which a capping layer, such as silicon nitride, is formed are conventional and hence, not elaborated upon herein.

An embodiment of the present invention is schematically illustrated in FIGS. 1–5, wherein similar reference numerals denote similar features. Adverting to FIG. 1, damascene opening 11, Such as a contact hole or via hole, is formed in dielectric layer 10, e.g., silicon dioxide. It should be understood that opening 11 can also be formed as a dual damascene opening comprising a contact or via hole in communication with a trench opening. A barrier layer 12 is deposited, such as TaN. A seed layer (not shown) can be deposited on barrier layer 12. Upon electroplating or electroless plating, a Cu or a Cu alloy layer 13 is deposited.

Figure 2:
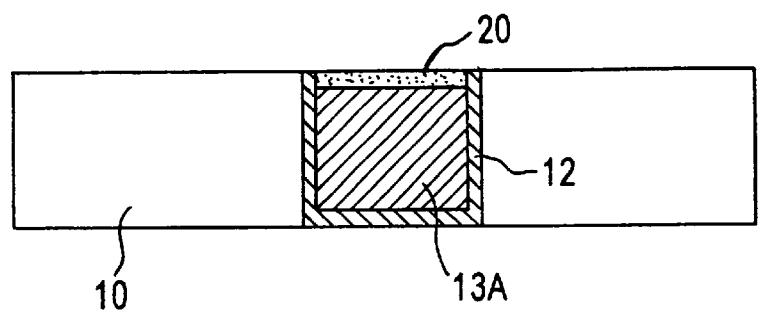

Adverting to FIG. 2, the portions of the Cu or Cu alloy layer 13 extending beyond opening 11 are removed, as by CMP stopping substantially on the underlying TaN barrier layer 20. CMP can be performed with a slurry, typically an aqueous suspension comprising an abrasive, such as alumina, an organic dispersant and an oxidizing agent. Buffing, employing pure water, can then be conducted on a buff pad to remove remaining slurry, particularly particulate materials. CMP is then performed employing a more aggressive slurry to remove the underlying TaN barrier layer followed by water buffing on a buff pad to remove residual slurry particulates. Subsequent to such CMP procedures, a further cleaning step can be conducted to remove contaminants such as abrasives, electrolytes and copper compounds from the surfaces of the wafer, e.g., double sided brush scrubbing.

Figure 3:
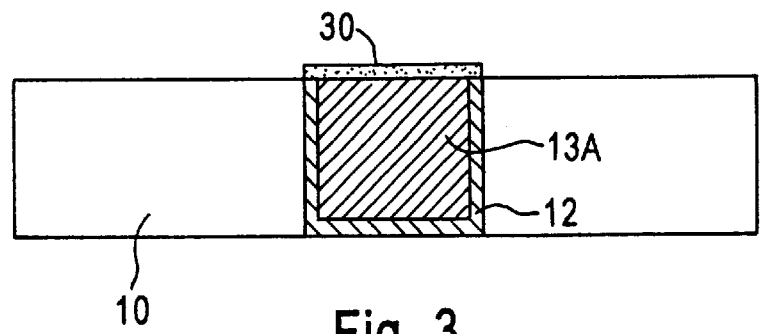

Adverting to FIG. 3, in accordance with embodiments of the present invention, the cleaned surface 30 of the Cu or Cu alloy interconnect member 13A is treated to form a controlled passivating film prior to any substantial oxidation. For example, the clean surface can be treated with a chemical such as azoles, benzotriazole, 1,2,4-triazole, 8-hydroxyquinoline, 2-mercaptobenzimidazole, imidazole, and alkanethiols to form a passivating film. A preferred alkanethiol is 2-mercaptobenzimidazole. A volatile passivating film is a substance which will vaporize from the Cu surface upon heating during subsequent processing steps, such as SiN deposition. In another embodiment, a passivating layer may be formed by electroless plating a metal layer on the surface of the Cu or Cu alloy layer. In a further embodiment, the passivating layer can be formed by depositing a metallic compound on the surface of the Cu/Cu alloy layer by CVD.

Figure 4:
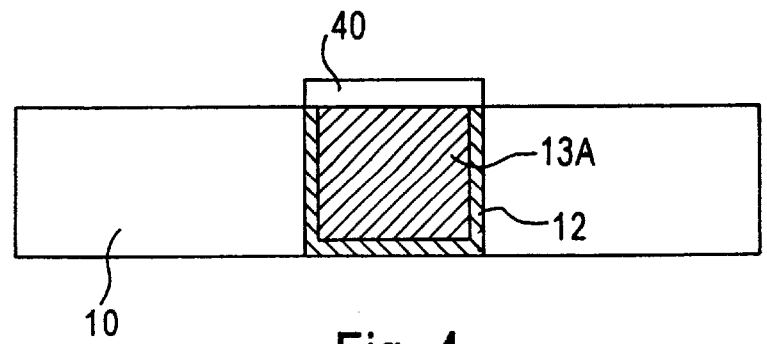

Examples of suitable conditions under which the passivating layer is formed are as follows; the Cu surfaces are exposed to a solution of the passivating compound, allowing the compound to coat and react with the thin native copper oxide on the metal surface. This solution may be applied during or subsequent to the wafer cleaning process after CMP. As shown in FIG. 4, a passivating layer 40 is then formed on the cleaned exposed surface 30 of Cu or Cu alloy interconnect 13. The passivating layer 40 is typically deposited at a thickness of about 30 Å to about 100 Å, and is formed on the exposed surface of the Cu or Cu alloy interconnect member 13A before any substantial oxidation of the Cu surface occurs. In the embodiment where a clean surface of the Cu or Cu alloy interconnect member 13A is treated by electroless plating a metal layer on the surface of the Cu or Cu alloy layer or selective (CVD) coating, the metal passivating layer 40 only forms on the underlying Cu or Cu alloy interconnect member 13A, i.e., the metal passivating layer is not deposited on the ILD.

Figure 5:
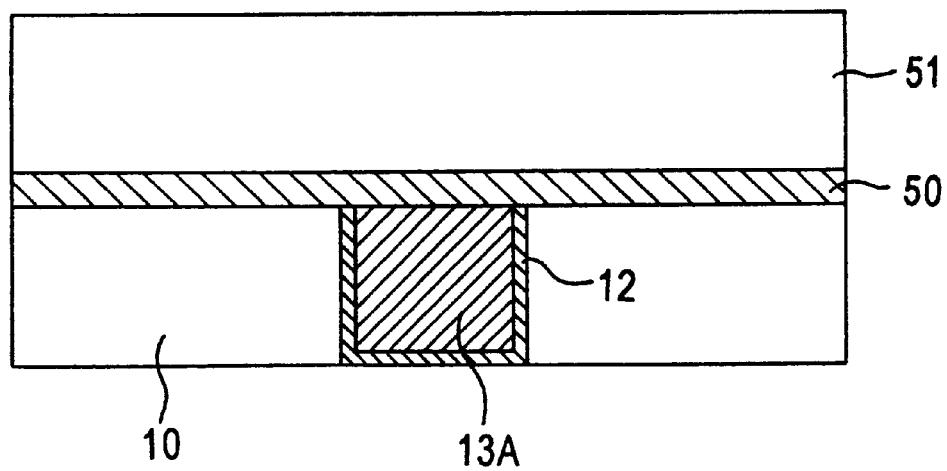

As shown in FIG. 5, the passivating layer 40 is then removed and a capping layer 50, such as silicon nitride, is then formed in a conventional manner completely encapsulating the Cu or Cu alloy interconnect member. The passivating layer can be removed by (1) heating the wafer under vacuum immediately prior to silicon nitride deposition, or (2) employing a hydrogen plasma treatment of the wafer prior to silicon nitride deposition, or (3) sputter etching the wafer surface. When the passivating layer is formed by treating the clean surface of the Cu or Cu alloy interconnect member 13A by electroless plating a metal layer on the surface of the Cu or Cu alloy layer or by selective CVD, the metal passivating layer 40 can also be retained (not shown). When a volatile passivating layer is formed by treating the clean surface of the Cu or Cu alloy interconnect member 13A with a passivating compound in solution, removal of the volatile passivating layer and deposition of the capping layer can be conducted in the same tool, such as a plasma CVD deposition reactor. Another dielectric layer or ILD 51 is then deposited, such as silicon dioxide derived from TEOS. In this way, a plurality of ILDs and metallization patterns are built up on a semiconductor substrate and various interconnects are formed.

In accordance with embodiments of the present invention, a selected passivating layer is purposely formed on an exposed surface of a Cu and/or Cu alloy interconnect member, thereby avoiding the adverse consequences stemming from formation of a thick copper oxide layer thereon. By selecting and controlling the formation and/or removal of the passivating layer, device reliability, performance and uniformity are improved.

The present invention is applicable to the formation of various types of inlaid Cu and Cu alloy metallization interconnection patterns. The present invention is particularly applicable in manufacturing semiconductor devices having submicron features and high aspect ratio openings.

In the previous descriptions, numerous specific details are set forth, Such as specific materials, structures, chemicals, processes, etc., in order to provide a better understanding of the present invention. However, the present invention can be practiced without resorting to the details specifically set forth. In other instances, well-known processing structures have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device on a wafer, which method comprises the steps of:

forming a Cu or Cu alloy interconnection pattern comprising a dense array of spaced apart Cu or Cu alloy lines having surfaces bordering an open dielectric field on a surface of the wafer;

forming a passivating layer on the surfaces of the Cu or Cu alloy lines by:
(a) treating the surfaces of the Cu or Cu alloy lines with a solution of a copper corrosion-inhibiting compound; or
(b) electroless plating a metal layer on the surfaces of each of the Cu or Cu alloy lines; or
(c) depositing a metallic compound on the surfaces of the Cu or Cu alloy lines by chemical vapor deposition (CVD); and capping the surfaces of the Cu or Cu alloy lines with a nitride compound wherein immediately before capping, the passivation layer is removed to expose the surfaces of the Cu or Cu alloy lines.

2. The method according to claim 1, wherein the step of forming the interconnection pattern includes depositing lines of Cu or a Cu alloy and chemical-mechanical polishing the deposited lines to form the interconnection pattern.

3. The method according to claim 1, comprising:

forming the passivating layer to a thickness of about 30 Å to about 100 Å.

4. The method according to claim 1, comprising:

forming the passivating layer by chemically treating the surface of the Cu or Cu alloy layer.

5. The method according to claim 1, wherein the copper corrosion-inhibiting chemical is selected from the group consisting of azoles, benzotriazole, 1,2,4-triazole, 8-hydroxyquinoline, 2-mercaptobenzimidazole, imidazole, and alkanethiols.

6. The method according to claim 1, wherein the step of forming the Cu or Cu alloy layer includes depositing a seed layer and electroplating or electroless plating the Cu or Cu alloy on the seed layer.

7. The method according to claim 1, wherein the step of forming the Cu or Cu alloy lines includes:

forming a dielectric layer overlying a substrate;

forming an opening in the dielectric layer;

depositing a barrier layer and a Cu seed layer in the opening and over the dielectric layer;

depositing the Cu or Cu alloy layer in the opening and over the barrier and Cu seed layers; and removing any portion of the Cu or Cu alloy layer and barrier layer beyond the opening by chemical mechanical polishing, leaving an exposed surface not substantially oxidized.

8. The method according to claim 7, comprising:

forming the capping layer by depositing a layer comprising silicon nitride.

9. The method according to claim 7, wherein the seed layer is deposited on the barrier layer and electroplating or electroless plating the Cu or Cu alloy on the seed layer.

10. The method according to claim 1, wherein the passivating, layer is a volatile material and wherein the passivating layer is removed and the capping layer is deposited by plasma CVD deposition.

* * * * *